(12) United States Patent
Jeong et al.

(10) Patent No.: US 6,627,966 B2
(45) Date of Patent: Sep. 30, 2003

(54) METHOD AND DEVICE FOR SEALING CERAMIC PACKAGE OF SAW FILTER

(75) Inventors: Seung Gyo Jeong, Kyungki-do (KR); Ji Hwan Shin, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 128 days.

(21) Appl. No.: 09/853,592

(22) Filed: May 14, 2001

(65) Prior Publication Data

US 2002/0062904 A1 May 30, 2002

(30) Foreign Application Priority Data

Nov. 29, 2000 (KR) .......................................... 2000-71506
Jan. 30, 2001 (KR) .......................................... 2001-4289

(51) Int. Cl.$^7$ ................................................. H03H 9/42
(52) U.S. Cl. .................... 257/416; 257/704; 156/292; 156/314; 333/193; 310/313 R
(58) Field of Search ............................ 156/89.12, 292, 156/314; 333/193; 310/313 R; 257/416, 678, 704

(56) References Cited

U.S. PATENT DOCUMENTS 6,388,545 B1 * 5/2002 Kawachi et al. ............ 333/193
6,424,233 B1 * 7/2002 Tonegawa et al. .......... 333/133

FOREIGN PATENT DOCUMENTS

JP          9-343044       12/1997
JP          10-291928      10/1998

OTHER PUBLICATIONS

Patent Abstract of Japan, Application No.:09–343044, Nakajima, "Seal Cap Component for Ceramics Package and Ceramics Package Using the Same", filed Dec. 12, 1997.

Patent Abstract of Japan, Application No.:10–291928, Kurihara, "Substrate Mounting Method for Saw Filter Chip", filed Oct. 14, 1998.

* cited by examiner

*Primary Examiner*—Jeff H. Aftergut
*Assistant Examiner*—John T. Haran
(74) *Attorney, Agent, or Firm*—Lowe Hauptman; Gilman & Berner LLP

(57) ABSTRACT

In a method and a device for sealing a ceramic package of a SAW (Surface Acoustic Wave) filter, when making a ceramic package of an environmentally sensitive SAW filter such as a SAW duplexer filter or a SAW filter, a first sealing is carried out between a ceramic main body and a metal case so as to protect the chip component, and then, a second sealing is carried out also between the metal case and the ceramic main body again, so that the shielding effect against external electromagnetic fields would be superior, and so that costs are reduced and so that a workability improvement can be realized, and so that the sealing can be made more secure. The first sealing is carried out on a step that is formed on the top of the ceramic main body to bond the metal case thereupon. The second sealing is carried out on the top of the ceramic main body to bond the metal case on the ceramic main body.

19 Claims, 5 Drawing Sheets

METHOD AND DEVICE FOR SEALING CERAMIC PACKAGE OF SAW FILTER

BACKGROUND OF THE INVENTION

1. Field of the Invention

The present invention relates to a method and a device for sealing a ceramic package of a SAW (Surface Acoustic Wave) filter, in which when making a ceramic package of an environmentally sensitive SAW filter such as a SAW duplexer filter or a SAW filter, a first sealing is carried out between a ceramic main body and a metal case so as to protect the chip component, and then, a second sealing is also carried out between the ceramic main body the metal case, so that the shielding effect against external electromagnetic fields would be superior, and so that the costs are reduced and so that workability can be improved, and so that the sealing can be made more secure.

2. Description of the Related Art

In the generally known conventional ceramic packaging, an air-tight status is maintained so that the environmentally sensitive various semiconductors or SAW filters or SAW duplexer filters can be protected from the external influences, and so that gas or moisture would not be generated within the ceramic package, thereby protecting the internal chip component.

Such a ceramic package for the conventional SAW filter is illustrated in FIG. 1. As shown in this drawing, a solder ball is disposed within a chip installing part 20 of a ceramic main body 10, so as to install a chip component 40. Alternatively, a conductive bond 30 or an ultraviolet ray-cured bond is spread on the bottom of the chip component 40 to carry out a bonding, and thus a chip wire 50 is drawn, thereby realizing an electrical connection through a bonding.

Furthermore, a metal case 70 is mounted upon the ceramic main body 10, and a surface electrode layer 80 made of Ag and a brazing material 60 made of Au/Sn are disposed between the metal case 70 and the ceramic main body 10, thereby carrying out a heat bonding.

In this conventional ceramic package constituted as described above, the chip component 40 is installed through the solder ball to the chip installing part that is installed within the ceramic main body 10, and then, it is electrically and mechanically secured. Alternatively, a conductive bond 30 or an ultraviolet ray—cured bond or the like is spread on the bottom of the chip component 40, and then, a chip wire 50 made of Au or Al is drawn, thereby electrically connecting the chip component 40.

A surface electrode layer 80 made of Ag is formed on the surface of the ceramic main body 10, and then, in order to seal off the chip component 40 of the ceramic main body 10, a brazing material made of Au(80%)/Sn(20%) is disposed between the metal case 70 and the main body 10. Then a heating is carried out at 300~800° C. for 5–10 minutes under an $N_2$ atmosphere, thereby sealing the package.

However, during the sealing operation, when working on the brazing material 60 for heat-bonding the Ag electrode layer 80 on the ceramic main body 10, the baking is carried out at a temperature of about 300~800° C. under an $N_2$ atmosphere, and therefore, the main body 10 which had already been baked is reduced and is made brittle. Further, a gas is introduced into the chip package, thereby adversely affecting the quality of the chip package.

Furthermore, the surface electrode layer 80 of the ceramic main body 10 makes it impossible to maintain an air-tight state due to the non-uniformness of the heat bonding. Furthermore, the brazing material is too expensive, and therefore, the manufacturing cost is increased.

SUMMARY OF THE INVENTION

The present invention is intended to overcome the above-described disadvantages of the conventional technique.

Therefore it is an object of the present invention to provide a ceramic package sealing device for a SAW filter, in which in order to protect the chip component within the ceramic main body, first and second sealing are carried out between a metal case and the ceramic main body so as to prevent an internal contamination, and so as to improve the shielding effect against external electromagnetic fields.

It is another object of the present invention to provide a method for sealing a ceramic package of a SAW filter, in which any gas generation from an epoxy resin or the like is prevented during the first sealing so as to prevent any quality degradation due to the presence of the gas, and through the second sealing, a baked curing becomes unnecessary so as to improve the sealing quality by the normal temperature curing, thereby achieving a reduced cost and an improvement of the workability.

It is still another object of the present invention to provide a method for sealing a ceramic package of a SAW filter, in which a paste adhesive is used during the sealing operation, so that a uniform sealing can be formed regardless of the surface conditions of the ceramic main body and the metal case.

In achieving the above objects, the device for sealing a ceramic package of a SAW filter according to the present invention includes: a ceramic main body with a chip installing part formed within it, for installing a chip component;

a first sealing part consisting of: a step formed on the ceramic main body; and a first bonding means, for securing a metal case by it; and a second sealing part consisting of: a surface electrode means and a second bonding means, for bonding the metal case and the ceramic main body together.

In another aspect of the present invention, the device for sealing a ceramic package of a SAW filter according to the present invention includes:

a ceramic main body with a chip installing part formed within it, for installing a chip component;

a first sealing part consisting of: a step formed on the ceramic main body, a surface electrode layer, and a first bonding means for securing a metal case; and a second sealing part consisting of: a second bonding means for making the metal case bonded to the ceramic main body.

In still another aspect of the present invention, the method for sealing a ceramic package of a SAW filter according to the present invention includes the steps of: i) preparing a ceramic main body with a chip component installing part formed within it; ii) forming a surface electrode layer on the ceramic main body; iii) securing a chip component and a chip wire on the chip component installing part of the ceramic main body; iv) carrying out a first sealing between the ceramic main body and the metal case; and v) carrying out a second sealing between the ceramic main body and the metal case integrally with a surface electrode layer of the ceramic main body.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION

The present invention will be described in detail referring to the attached drawings.

Figure 1:
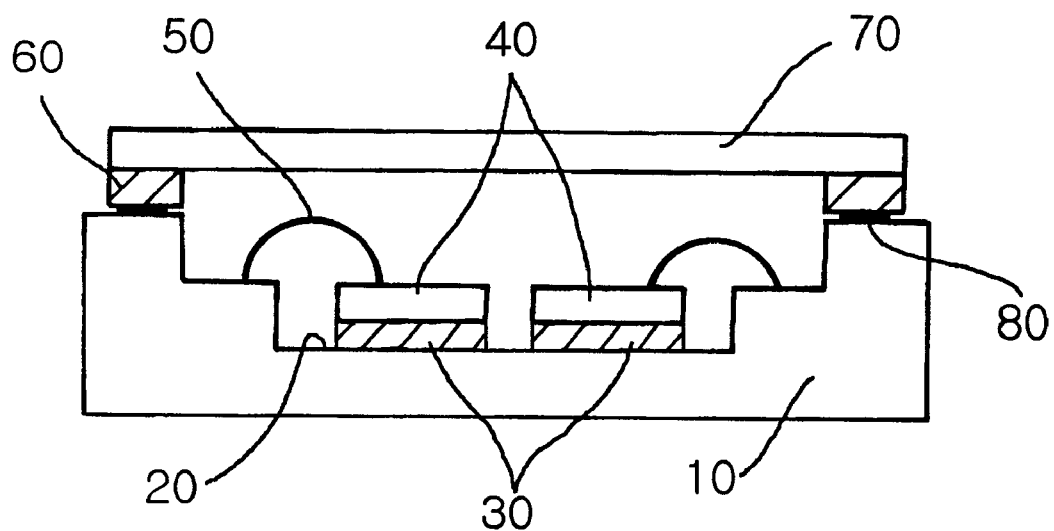
FIG. 1 is a side sectional view of the ceramic package based on the conventional SAW filter package sealing method.
Figure 2:
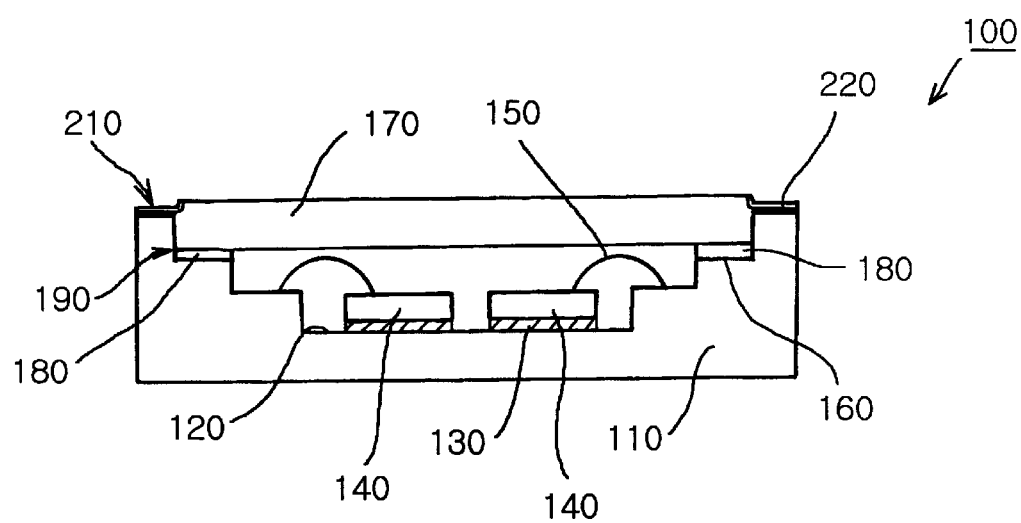
FIG. 2 is a side sectional view of the ceramic package based on the SAW filter package sealing method according to an embodiment of the present invention.
Figure 3:
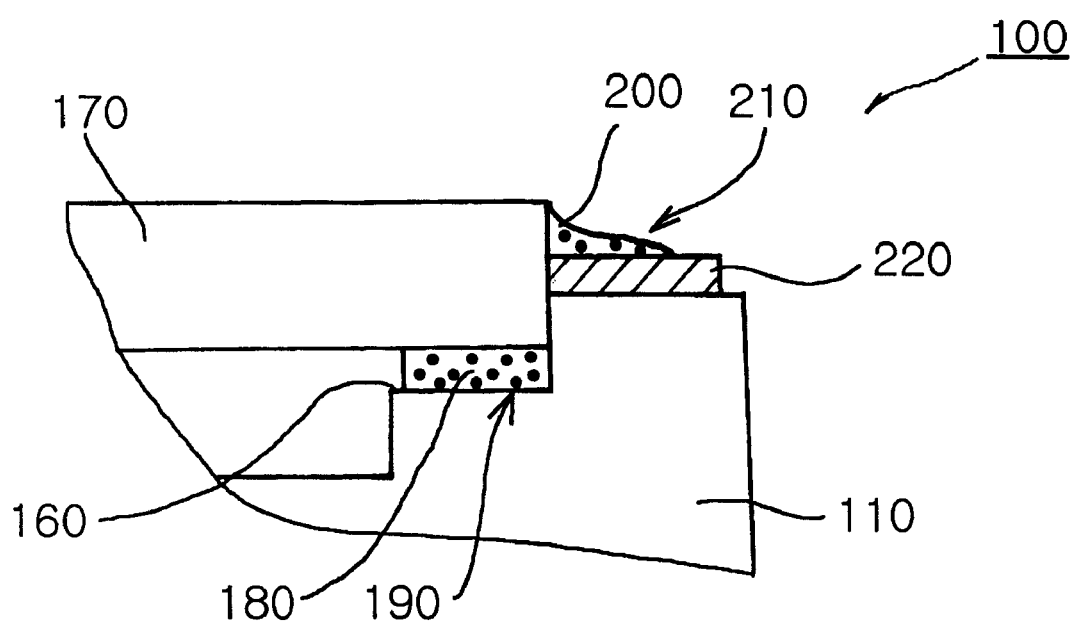
FIG. 3 is an enlarged view of the portion A of FIG. 2.

FIG. 2 is a side sectional view of the ceramic package based on the SAW filter package sealing method according to an embodiment of the present invention. FIG. 3 is an enlarged view of the portion A of FIG. 2.

As shown in these drawings, a solder ball is disposed within a chip installing part 120 of a ceramic main body 110 so as to install a chip component 140. Alternatively, a conductive bond 130 or an ultraviolet ray-cured bond or the like is spread on the bottom of the chip component 140 to bond it, and a chip wire 150 made of Au or Al is drawn to electrically connect it.

Furthermore, a surface electrode layer 220 made of Ag, Ni and Au films is formed on the surface of the ceramic main body 110, and then, a metal case 170 is attached thereupon.

Then a step 160 is formed on the upper portion of the ceramic main body 110, and then a first bonding means 180 made of an epoxy resin or an insulating adhesive is spread on the step 160 to bond a metal case 170 on the ceramic main body 110, thereby forming a first sealing part 190.

Then the metal case 170 is bonded again to the ceramic main body 110 through the surface electrode layer 220 by using a second bonding means 200 such as a conductive adhesive or a soldering, thereby forming a second sealing part 210.

Now the method for sealing the ceramic package according to the present invention will be described.

As shown in FIGS. 2 and 3, a chip installing part 120 in the form of a recess is formed within the ceramic main body 110, and Ag is printed on the surface of the top of the ceramic main body 110 to bake it. Then Ni and Au are deposited to a certain thickness, thereby forming a surface electrode layer 220.

After the completion of formation of the surface electrode layer 220, a solder ball is disposed within the chip installing part 120 of the ceramic main body 110 to install a chip component 140. Alternatively, a conductive bond 130 or an ultraviolet ray-cured bond or the like is spread on the bottom of the chip component 140 to bond it, and a chip wire 150 made of Au or Al is drawn. Then a bonding is carried out, thereby completing the installation of the chip component 140.

Then the metal case 170 is placed and bonded on the surface electrode layer 220 of the ceramic main body 110, thereby completing the ceramic package 100.

Meanwhile, when carrying out the sealing operation for the ceramic package 100, a step 160 is formed on the top of the ceramic main body 110, and the metal case 170 is bonded onto the step 160 by using a first bonding means 180 such as an epoxy resin or an insulating adhesive.

The first bonding means 180 in the form of a slurry state is cured at the normal temperature or at a low temperature, and therefore, the metal case 170 is bonded with a high bonding uniformity, thereby forming a first sealing part 190.

Then a second bonding means 200 such as a soldering or conductive adhesive is spread and cured on the surface electrode layer 220 of the ceramic main body 110 to bond the metal case 170 onto the ceramic main body 110, thereby completing a second sealing, and forming a second sealing part 210.

By the second sealing part 210, the surface electrode layer 220 of the ceramic main body 110 is bonded to the metal case 170 owing to the second bonding means 200 to seal off the ceramic main body 110. Under this condition, the gas that is generated during the sealing operation cannot intrude into the interior of the ceramic package, and therefore, any internal contamination of the ceramic package can be prevented.

Further, when carrying out the sealing between the ceramic main body 110 and the metal case 170, the first and second sealing means are pastes such as an epoxy resin or an insulating adhesive, and a solder or a conductive adhesive respectively.

Accordingly, regardless of the surface roughness of the metal case 170 and the ceramic main body 110, the sealing can be formed to a uniform state. Furthermore, the bonding means are cured at the normal temperature, and therefore, a high temperature baking process is not required unlike in the conventional method.

Figure 4:
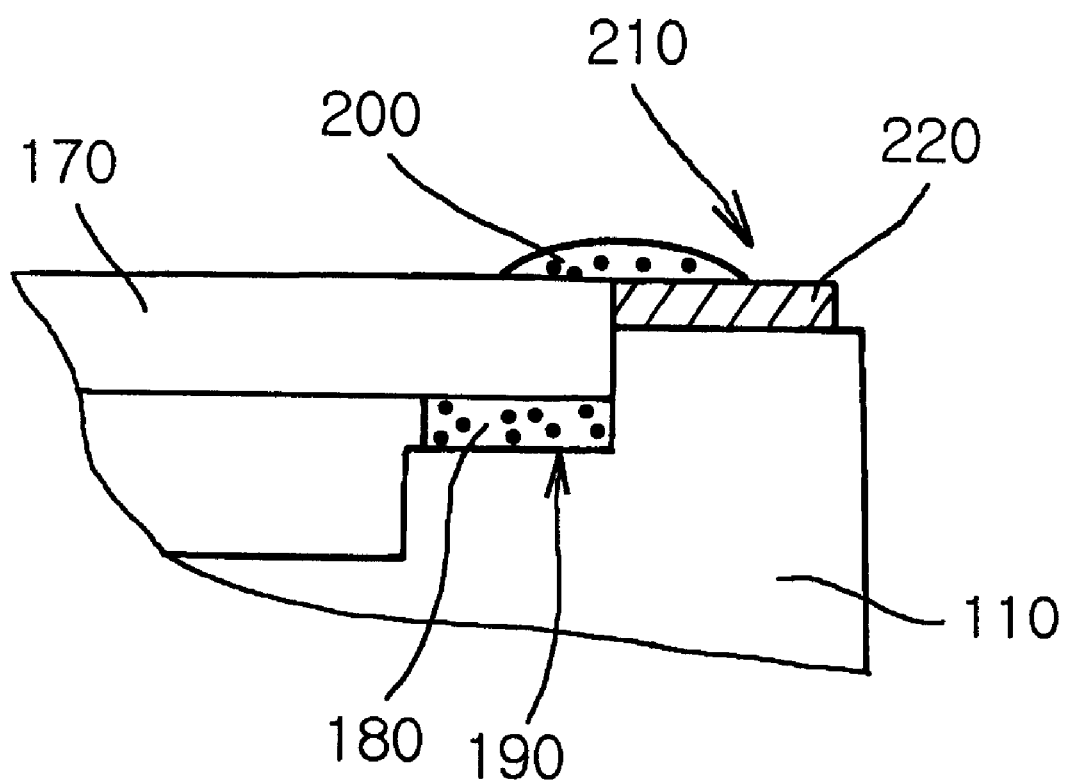
FIG. 4 is an enlarged sectional view showing another embodiment of the ceramic package based on the SAW filter package sealing method according to the present invention.

FIG. 4 is an enlarged sectional view showing another embodiment of the ceramic package based on the SAW filter package sealing method according to the present invention.

In this second embodiment, the second sealing is carried out in the following manner. That is, the metal case 170 is soldered on the surface electrode layer 220 of the ceramic main body 110 in a state with the surface electrode layer 220 and the metal case 170 postured horizontally, thereby forming a second sealing part 210 in the form of a soldered part 200. Therefore, the soldering workability is improved, and the installation of the ceramic package 100 is rendered easier.

Figure 5:
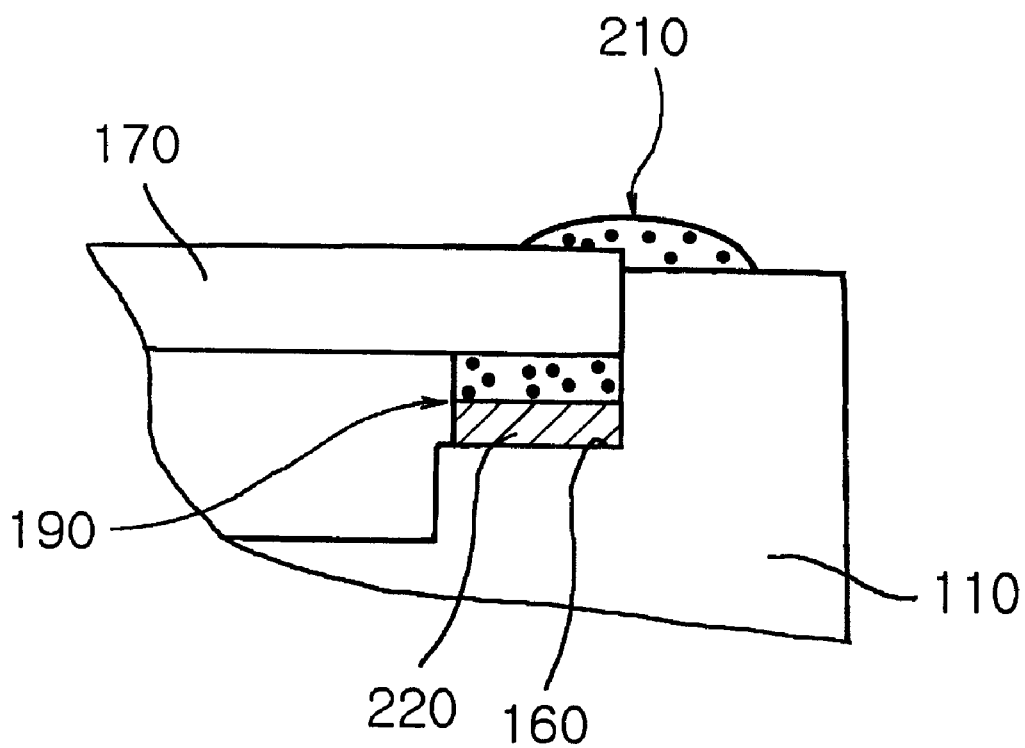
FIG. 5 is a side sectional view showing still another embodiment of the ceramic package based on the SAW filter package sealing method according to the present invention.

FIG. 5 is a side sectional view showing still another embodiment of the ceramic package based on the SAW filter package sealing method according to the present invention.

In this embodiment, the surface electrode layer 220 is formed on the step 160 of the ceramic main body 110 instead of on the top of the ceramic main body 110. Then a conductive adhesive or an insulating adhesive is spread thereupon, thereby forming a first sealing part 190.

Then an insulating adhesive or an epoxy resin is spread on the metal case 170 and on the top of the ceramic main body 110, thereby forming a second sealing part 210. This embodiment can reap the same effect as that of the first and second embodiments.

According to the present invention as described above, the metal case is attached onto the ceramic main body through first and second sealing procedures. Accordingly, any internal contamination of the ceramic package can be prevented, and the shielding effect against external electromagnetic fields becomes superior owing to the dual sealing structure.

Further, during the first sealing procedure, any gas generation due to the use of the resin can be prevented so as to avoid the quality degradation, and owing to the second sealing, a baking is not required because the resin is cured at the normal temperature, with the result that the sealing quality is improved, the sealing workability is also improved, and a reduced cost is rendered possible.

Furthermore, the bonding means have the form of a paste, and therefore, regardless of the surface roughness of the metal case and the ceramic main body, the sealing can be made uniform.

In the descriptions above, the present invention was described based on the specific preferred embodiments and the attached drawings, but it should be apparent to those ordinarily skilled in the art that various changes and modifications can be added without departing from the spirit and scope of the present invention that will be defined in the appended claims.

What is claimed is:

1. A device for sealing a ceramic package of a SAW (Surface Acoustic Wave) filter, comprising:
    a ceramic main body with a chip installing part formed therein, for installing a chip component;
    a first sealing part consisting of a step formed on said ceramic main body and a first bonding means for securing a metal case thereupon; and
    a second sealing part consisting of a surface electrode layer and a second bonding means for bonding the ceramic main body through the surface electrode layer and said metal case together.

2. The device as claimed in claim 1, wherein said first bonding means comprises an epoxy resin or an insulating adhesive.

3. The device as claimed in claim 1, wherein said second bonding means comprises a soldering material or a conductive adhesive.

4. The device as claimed in claim 1, wherein said second sealing part comprises said second bonding means for bonding said metal case and said ceramic main body together to seal off said ceramic main body.

5. The device as claimed in claim 1, wherein said surface electrode layer comprises an Ag layer.

6. The device as claimed in claim 1, wherein said surface electrode layer of said ceramic main body of comprises an Ag layer and Ni and Au films coated thereupon.

7. The device as claimed in claim 1, wherein said surface electrode layer of said ceramic main body and said metal case soldered on said surface electrode layer are arranged horizontally to form said second sealing part.

8. A device for sealing a ceramic package of a SAW (Surface Acoustic Wave) filter, comprising:
    a ceramic main body with a chip installing part formed within it for installing a chip component;
    a first sealing part consisting of a step formed on said ceramic main body, a surface electrode means, and a first bonding means for securing a metal case to the step formed on said ceramic main body; and
    a second sealing part consisting of a second bonding means for bonding the metal case to said ceramic main body.

9. The device as claimed in claim 8, wherein said first bonding means comprises a soldering material or a conductive adhesive.

10. The device as claimed in claim 8, wherein said second bonding means comprises an epoxy resin or an insulating adhesive.

11. The device as claimed in claim 8, wherein said first sealing part bonds said metal case to said ceramic main body through said surface electrode layer and said second bonding means.

12. The device as claimed in claim 8, wherein said surface electrode layer comprises an Ag layer.

13. The device as claimed in claim 8, wherein said surface electrode layer comprises an Ag layer and Ni and Au films coated thereupon.

14. A method of sealing a ceramic package of a SAW (Surface Acoustic Wave) filter, comprising the steps of:
    i) preparing a ceramic main body with a step and with a chip component installing part formed within it;
    ii) forming a surface electrode layer on said ceramic main body;
    iii) securing a chip component and a chip wire on said chip component installing part of said ceramic main body;
    iv) carrying out a first sealing between said ceramic main body and a metal case; and
    v) carrying out a second sealing between said ceramic main body through the surface electrode layer of said ceramic body and said metal case;
    wherein one of the first and second sealings results in the metal case being bonded to the step formed in the ceramic main body.

15. The method as claimed in claim 14, wherein, in step ii, Ag is printed on a top of said ceramic main body and is baked, and then Ni and Au films are coated thereupon so as to form said surface electrode layer.

16. The method as claimed in claim 14, wherein, in step iv of carrying out said first sealing, a step is formed on said ceramic main body, an epoxy resin or an insulating adhesive is spread on said step, and said metal case is placed thereupon, thereby completing said first sealing.

17. The method as claimed in claim 14, wherein, in step v of carrying out said second sealing, a soldering is carried out or a conductive adhesive is spread on said surface electrode layer, to bond said metal case thereupon, thereby carrying out said second sealing.

18. The method as claimed in claim 14, wherein an epoxy resin or an insulating adhesive for said first sealing is spread in a form of a paste and is cured to bond said metal case and said ceramic main body together to a uniform state regardless of a surface roughness of the metal case or the ceramic main body.

19. The method as claimed in claim 14, wherein a conductive adhesive for said second sealing is spread in a form of a paste and is cured to bond said metal case and said ceramic main body together to a uniform state regardless of a surface roughness of the metal case or the ceramic main body.

* * * * *